United States Patent [19]

Kobayashi

[11] 4,317,081
[45] Feb. 23, 1982

[54] SINGLE-ENDED PUSH-PULL POWER AMPLIFIER HAVING IMPROVED HIGH FREQUENCY CHARACTERISTICS

[75] Inventor: Toshio Kobayashi, Tokyo, Japan

[73] Assignee: Nippon Electric Co., Ltd., Tokyo, Japan

[21] Appl. No.: 85,417

[22] Filed: Oct. 16, 1979

[30] Foreign Application Priority Data

Oct. 16, 1978 [JP] Japan .................... 53-127159

[51] Int. Cl.³ .................................. H03F 3/30
[52] U.S. Cl. ........................... 330/268; 307/300
[58] Field of Search ............. 330/262, 263, 268, 267, 330/273, 274; 307/300

[56] References Cited

U.S. PATENT DOCUMENTS 3,831,102 8/1974 Medal .................... 307/300 X

Primary Examiner—James B. Mullins
Attorney, Agent, or Firm—Laff, Whitesel, Conte & Saret

[57] ABSTRACT

A power amplifier has first and second, complementary power transistors with their emitter-collector paths connected in series between power supply terminals. An input signal applied to bases of these transistors operates them in a complementary manner. First and second current-voltage converters have their ends connected respectively to the respective bases of the first and second transistors. An additional two transistors have their respective bases connected to the other ends of the first and second current-voltage converters. A time constant required for the charge carrier stored in the first and second transistors to discharge is determined by the product of the base-collector capacitances of the first and second transistors multiplied by the dynamic resistances, upon conduction, of the collector-emitter path of the additional transistors. Since the additional transistors are conducting when the stored charge carriers discharge, the dynamic resistances of their collector-emitter paths are very low, and the time constant for the stored carriers to discharge becomes very small. In other words, since the stored carriers can be discharged quickly through the additional transistors, the disadvantages in the prior art (such as poor fidelity in the high-frequency range generation of a D.C. component in the output, and an abnormal current) can be eliminated.

15 Claims, 11 Drawing Figures

SINGLE-ENDED PUSH-PULL POWER AMPLIFIER HAVING IMPROVED HIGH FREQUENCY CHARACTERISTICS

The present invention relates in general to a power amplifier, and more particularly, to a power amplifier having a complementary, single-ended, push-pull output stage.

In a prior art complementary single-ended push-pull stage, a PNP power transistor and an NPN power transistor are connected between power supply terminals with their collector-emitter paths connected in series. An input signal is applied to the bases of these PNP and NPN power transistors. An output is derived from a midpoint of the series connection of these PNP and NPN power transistors. In order to obtain a high gain of the output stage, each power transistor uses a compound power transistors formed by connecting a plurality of transistors in a Darlington circuit. Such a complementary single-ended push-pull stage is widely used because it has a low output impedance and a high utilization efficiency of the power supply voltage.

In a low frequency range of an input signal, a high fidelity of the input-output characteristics can be obtained in such a complementary single-ended push-pull stage. It has such a disadvantage in a high frequency range of an input signal that power consumption becomes large due to charge storage in the output transistor. In the worst case, the output transistor may be broken or the output may become distorted. More particularly, as the frequency of the input signal is rasied, after one of the two PNP and NPN power transistors becomes saturated in its conducting state during one half cycle of the input signal, a large charge stored in the saturated transistor can not be fully discharged during the next subsequent half cycle. As a result, a current will always flow through both of the power transistors. Consequently, electric power consumption is increased. If such a state becomes remarkable, the respective transistors will be kept in a saturated conducting state, where a current close to infinity flows through the collector-emitter paths of the respective power transistors, resulting in their thermal breakdown. Moreover, due to this stored charge, the ON-OFF states of the respective transistors would not follow the input signal, and thus distortion would appear in the output.

Therefore, it is one object of the present invention to provide a power amplifier which is free from the above-described disadvantages which are found in the prior art. Another object is to provide a power amplifier which has excellent high frequency characteristics, and which has a protective circuit for preventing a generation of a D.C. component in a high frequency band and a generation of an abnormal current upon saturation of an output transistor.

According to one feature of the present invention, a power amplifier comprises first and second power transistors having their emitter-collector paths connected in series between power supply terminals. An input signal is applied to bases of the first and second power transistors so as to operate them second transistors in a complementary manner. An output is derived from the series connection of the first and second transistors. First and second current-voltage converters have their first ends connected to the respective bases of the first and second transistors, and an additional two transistors have their respective bases connected to the other ends of the first and second current-voltage converters. Their respective emitters and collectors are connected between the bases of the first and second transistors.

In the above-featured power amplifier according to the present invention, the time constant required for the charge carriers stored in the first and second transistors to discharge is determined by the product of the base-collector capacitances of the first and second transistors multiplied by the dynamic resistances, when conducting of the collector-emitter path of the newly added transistors. Since the newly added transistors are conducting when the stored charge discharges, the dynamic conducting resistances of their collector-emitter path are very low. Then, the time constant for the storage carrier to discharge becomes very small. In other words, since the stored carrier can be quickly discharged through the newly added transistors, the disadvantages in the prior art (such as poor fidelity in the high frequency range and generation of a D.C. component in output and an abnormal current) can be eliminated.

The above-mentioned and other features and objects of the invention will become more apparent from the following description taken in conjunction with the accompanying drawings, wherein.

Figure 1:
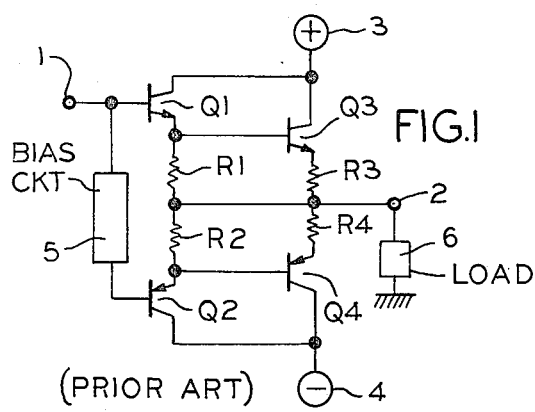
FIG. 1 is a circuit diagram of a power amplifier in the prior art.

Heretofore, a power amplifier having a complementary single-ended push-pull circuit (hereinafter abbreviated as "complementary SEPP circuit") as its output stage, has been known. For example, a known power amplifier is constructed as shown in FIG. 1.

In this figure, driving emitter-follower transistors $Q_1$ and $Q_2$ are connected to form Darlington circuits jointly with a NPN transistor $Q_3$ and a PNP transistor $Q_4$, respectively, which together form a complementary SEPP circuit. The transistors $Q_1$ and $Q_3$ and the transistors $Q_2$ and $Q_4$ alternately amplify the current in an input signal, applied via an input terminal 1. The output signal appears at an output terminal 2 and feeds a load 6. The output terminal 2 is connected to a junction between the respective emitter resistors $R_3$ and $R_4$ of the transistors $Q_3$ and $Q_4$. The junction is further connected to a junction between respective load resistors $R_1$ and $R_2$ of the driving emitter-follower transistors $Q_1$ and $Q_2$. The base of the transistor $Q_1$ is connected to the input terminal 1, and the collector is connected to a junction between a positive power supply terminal 3 and the collector of the transistor $Q_3$. The base of the transistor $Q_2$ is connected through a bias circuit 5 to the input terminal 1, and the collector is connected to a junction between a negative power supply terminal 4 and the collector of the transistor $Q_3$. In addition, the base of the transistor $Q_3$ is connected to the emitter of the transistor $Q_1$, while the base of the transistor $Q_4$ is connected to the emitter of the transistor $Q_2$.

Figure 2:
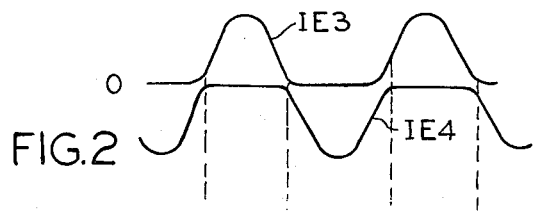
FIGS. 2, 3, 5 and 6 are waveform diagrams for an emitter current of an output transistor in the prior art power amplifier.

In such a power transistor, the transistors $Q_1$ and $Q_3$ conduct during a positive half cycle of an input signal, while the transistors $Q_2$ and $Q_4$ are not conducting. During a negative half cycle of the input signal, the transistors $Q_2$ and $Q_4$ conduct, while the transistors $Q_1$ and $Q_2$ become non-conducting. Therefore, emitter currents $I_{E3}$ and $I_{E4}$ flowing through the emitter resistors $R_3$ and $R_4$, respectively, take the waveforms as shown in FIG. 2.

Figure 3:
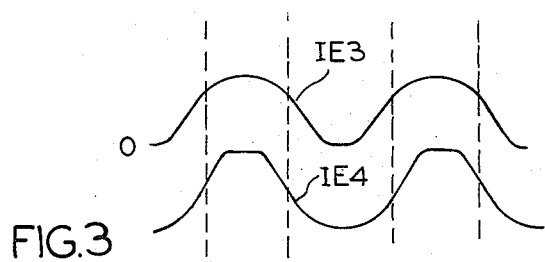
Figure 4:
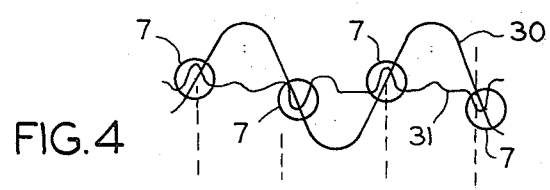
FIG. 4 is a waveform diagram for an output current and a distortion component in the prior art power amplifier.
Figure 5:
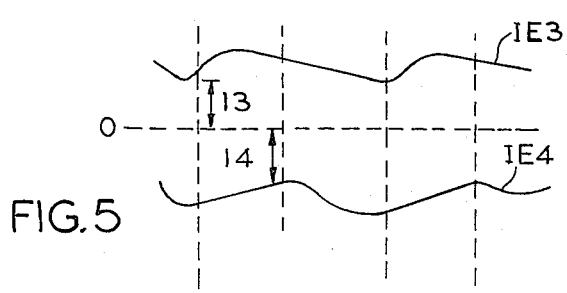

However, as the frequency of the input signal increases to, for example, about 100 KHz, the durations of the emitter currents $I_{E3}$ and $I_{E4}$ through the emitter resistors $R_3$ and $R_4$, respectively, becomes longer than a half cycle period of the input signal, as shown in FIG. 3. This results in a poor fidelity of the input-output characteristics. In addition, a notching distortion 7 in a distortion current component 31 (FIG. 4) is also increased. If the frequency of the input signal is further raised, then the waveforms of the emitter currents $I_{E3}$ and $I_{E4}$ are varied as shown in FIG. 5. Currents $I_3$ and $I_4$ may always flow through the transistors $Q_3$ and $Q_4$, respectively, as a D.C. current. Since these currents $I_3$ and $I_4$ always flow between the terminals 3 and 4 of the power supply, through the output transistors $Q_3$ and $Q_4$, an excessive electric power consumption results. Furthermore, it causes a deterioration of the output transistors $Q_3$ and $Q_4$. If the currents $I_3$ and $I_4$ are large, they may sometimes cause the output transistors $Q_3$ and $Q_4$ to break down.

These currents $I_3$ and $I_4$ flow through the output transistors $Q_3$ and $Q_4$ when the output transistor changes to a non-conducting state from a saturated conducting state, because the emitter-follower transistor which drives the output transistor becomes non-conducting earlier than the output transistor.

In more detail, when the output transistor becomes conducting during one half of the input signal charge carriers are stored in the output transistor. Then, when the input signal changes to the other half cycle, the charge carriers stored in the output transistor $Q_3$ (or $Q_4$) are discharged through the resistors $R_1$ and $R_2$. The time constant of this discharge determined by the product of the input capacitance of the output transistor $Q_3$ (or $Q_4$), as viewed from its base, multiplied by the load impedance $(R_1 + R_2)$ of the driving emitter-follower transistor $Q_1$ (or $Q_2$). Accordingly, the collector current of the output transistor $Q_3$ (or $Q_4$) continues to flows even after the transistor $Q_1$ (or $Q_2$) has become non-conducting, unless the stored charge carriers are fully discharged.

Thus, if the period of one half cycle of the input signal is shorter than the time constant required for the stored charge carriers to discharge, the collector current continues to flow even when the input signal enters another half cycle. In addition, if the frequency of the input signal is further raised and the one half cycle period is further shortened, the storage of the charge carriers of the output transistor $Q_3$ (or $Q_4$) becomes unable to discharge. Thus the collector current will flow continuously, and as a result, the emitter currents $I_{E3}$ and $I_{E4}$ flowing through the emitters of the transistors $Q_3$ $Q_4$ have large D.C. currents $I_3$ and $I_4$. Accordingly, due to these D.C. currents $I_3$ and $I_4$, the operating temperatures of the output transistors $Q_3$ and $Q_4$ raises and finally they lose their transistor action by breaking down.

Figure 6:
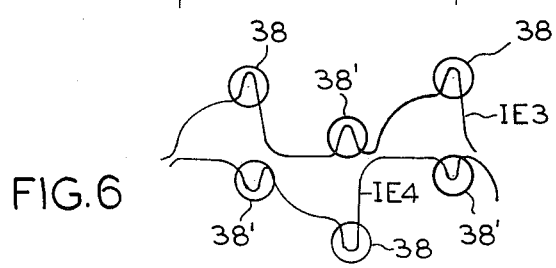

In addition, in a power amplifier having the heretofore known circuit construction as shown in FIG. 1, if an output is saturated, abnormal currents 38 and 38' (FIG. 6) appear in the emitter currents $I_{E3}$ and $I_{E4}$. More particularly, if the output transistor $Q_3$ or $Q_4$ saturates during the conducting state the PN-junction between the base and the collector is forwardly biased since the base-emitter saturation voltage of the output transistors $Q_3$ and $Q_4$ is larger than the collector-emitter saturation voltage. Hence, the input capacitance as viewed from the base would become very large as compared to the capacitance during an unsaturated condition. Accordingly, in the case where the conducting state of the output transistor saturates, the very large capacitance between the base and the collector is charged, and consequently, a large amount of charge carriers is stored. As a result, when this output transistor is released from the saturated condition, and if the time constant for the stored charge carriers to discharge is large, then the stored charge carriers flow transiently from the emitter into the base of the emitter follower transistor $Q_1$ or $Q_2$, the flow being via the capacitance between the emitter and base thereof. As a result, the PN-junction in the emitter-follower transistor is backwardly biased, and this backwardly biasing voltage causes the other emitter follower transistor conduct. The output transistor, which has been in a cut-off state, becomes conductive. Consequently, both output transistors become conductive, and hence the abnormal currents flow.

Figure 7:
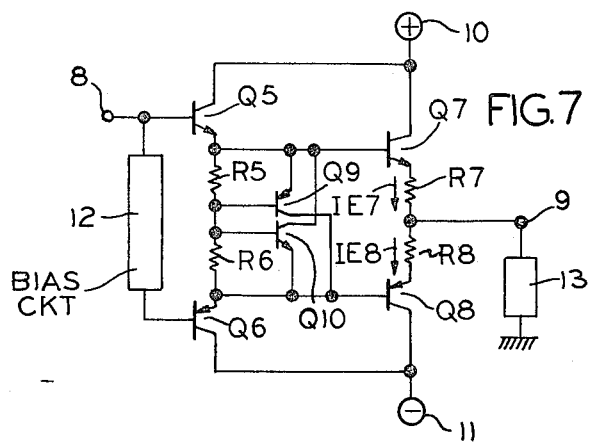
FIG. 7 is a circuit diagram of a power amplifier according to one preferred embodiment of the present invention.

FIG. 7 shows one preferred embodiment of the present invention. Emitter follower transistors $Q_5$ and $Q_6$ are connected with output transistors $Q_7$ and $Q_8$, respectively, so as to form a Darlington circuit. The collectors of the transistors $Q_5$ and $Q_7$ are connected to a positive power supply terminal 10, which the collectors of the transistors $Q_6$ and $Q_8$ are connected to a negative power supply terminal 11. The emitters of the transistors $Q_5$ and $Q_6$ are mutually connected through the series connection of resistors $R_5$ and $R_6$. The emitters of the transistors $Q_7$ and $Q_8$ are connected to each other through the series connection of resistors $R_7$ and $R_8$. An input signal received at an input terminal 8 is applied directly to the base of the transistor $Q_5$, while it is applied to the base of the transistor $Q_6$ by way of a bias circuit element 12. An output is derived from the junction point between the resistors $R_7$ and $R_8$ and applied to a load 13, through an output terminal 9. In this manner, the principal circuit of the complementary SEPP circuit is constructed.

Transistors $Q_9$ and $Q_{10}$ are additional transistors which are inserted into the principal circuit of the complementary SEPP circuit. The transistor $Q_9$ is a PNP transistor having its emitter connected to a base of an NPN transistor $Q_7$, its collector connected to a base of a PNP transistor $Q_8$, and its base connected to a junction between resistors $R_5$ and $R_6$. The transistor $Q_{10}$ is an NPN transistor having its collector connected to the base of the NPN transistor $Q_7$, its emitter connected to the base of the PNP transistor $Q_8$, and its base connected to the same junction of the resistors $R_5$ and $R_6$.

In the circuit shown in FIG. 7, the time constant for discharging the stored charge carriers in the output transistors $Q_7$ and $Q_8$ is determined by the product of the capacitance between the base and collector of the respective output transistors $Q_7$ and $Q_8$, multiplied by the resistance of the parallel connection of the collector-emitter dynamic resistances of the transistors $Q_9$ and $Q_{10}$. Normally, the resistances of the resistors $R_5$ and $R_6$ are selected at a value of about $100 \sim 300\Omega$. Hence, the dynamic resistance of the transistors $Q_9$ and $Q_{10}$ is far lower than the resistance of the resistors $R_5$ and $R_6$.

Figure 8:
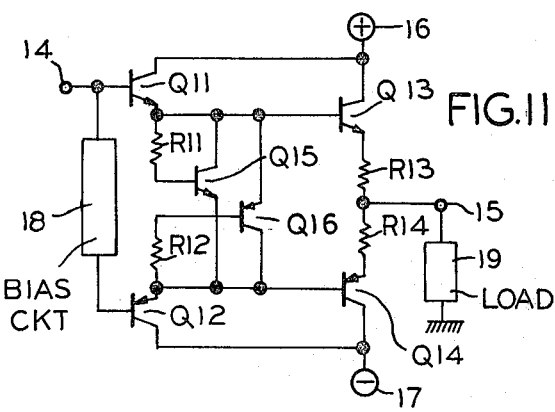
FIGS. 8 and 10 are waveform diagrams for an emitter current of an output transistor in a power amplifier according to one preferred embodiment of the present invention.

Accordingly, even when the emitter follower transistor $Q_5$ changes from an on state to a cut-off state, the charge carriers stored in the output transistor $Q_7$ during the period when the transistor was conductive can be quickly discharged through the collector-emitter paths of the transistors $Q_9$ and $Q_{10}$. The collector current of the output transistor $Q_7$ can thus be quickly turned off in response to a change of the input signal. Therefore, even at a frequency of about 100 KHz, the emitter currents $I_{E7}$ and $I_{E8}$ flowing through the emitter resistors $R_7$ and $R_8$ of the output transistors $Q_7$ and $Q_8$ present the normal waveforms as shown in FIG. 8. These wave forms do not have the disadvantages that a D.C. current component appears in the output when respective transistors $Q_3$ and $Q_4$ are conductive for periods which are longer than one half cycle of the input signal.

Figure 9:
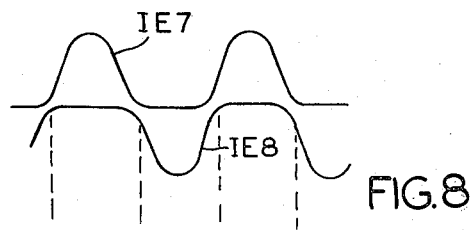
FIG. 9 is a waveform diagram for an output current and a distortion component in a power amplifier according to one preferred embodiment of the present invention.

These are the prior art D.C. components shown in FIGS. 3 and 5. Likewise, owing to the aforementioned provision, the notching distortion can be also improved (FIG. 9).

Accordingly, even in a high frequency region, distortions do not arise in the output. The excessive electric power consumption in the output transistors is eliminated. Deterioration and breakdown of the output transistors obviated. Further, the notching distortion in a stereophonic audio amplifier, degrades tone quality and causes a tone distorted at a high frequency. However, since the notching distortion can be widely improved, as compared to the prior art power amplifier, an additional advantage of improving tone quality can be also attained.

Figure 10:
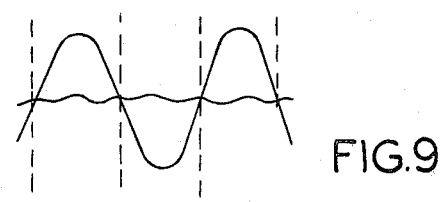

In addition, since the stored charge carriers of the output transistor $Q_7$ (or $Q_8$) can be quickly discharged through the transistors $Q_9$ and $Q_{10}$, as described above, the storage carrier flows into the base-emitter path of the emitter-follower transistor $Q_5$ to backwardly bias the base-emitter path of the transistor $Q_6$. Thus the emitter-follower transistor $Q_6$ is not made to conduct and the output transistor $Q_8$ is made to conduct. Accordingly, both of the output transistors $Q_7$ and $Q_8$ cannot be simultaneously conducting. The generation of the abnormal current is also eliminated (FIG. 10).

As described above, according to the illustrated embodiment of the present invention, all the disadvantages in the prior art can be eliminated. One can obtain a power amplifier having excellent fidelity in high frequency range and can protect the output transistors from being broken down.

Figure 11:
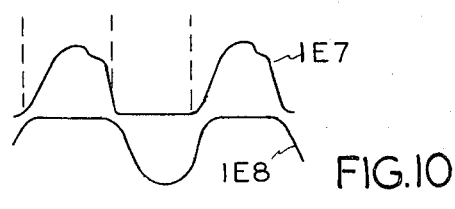
FIG. 11 is a circuit diagram of a power amplifier according to another preferred embodiment of the present invention.

A circuit diagram of another preferred embodiment of the present invention is shown in FIG. 11. Transistors $Q_{11}$ to $Q_{14}$ respectively correspond to the transistors $Q_5$ to $Q_8$ of FIG. 7 and constitute two Darlington circuits respectively operating as an NPN transistor and a PNP transistor. Resistors $R_{13}$ and $R_{14}$, corresponding to the resistors $R_7$ and $R_8$, are inserted between the emitters of the transistors $Q_{13}$ and $Q_{14}$. The collectors of the transistors $Q_{11}$ and $Q_{13}$ and the collectors of the transistors $Q_{12}$ and $Q_{14}$ are respectively connected to a positive power supply terminal 16 and a negative power supply terminal 17. An input signal, received at an input terminal 14, is applied directly to the base of the transistor $Q_{11}$ and to the base of the transistor $Q_{12}$ by way of a bias circuit element 18. An output is derived from an output terminal 15 connected to the junction between the resistors $R_{13}$ and $R_{14}$. The output is fed to a load 19.

Additionally, transistors $Q_{15}$ and $Q_{16}$ and resistors $R_{11}$ and $R_{12}$ are inserted into the basic circuit. The base of the transistor $Q_{15}$ is connected via a resistor $R_{11}$ to the emitter of the transistor $Q_{11}$, while the base of the transistor $Q_{16}$ is connected via a resistor $R_{12}$ to the emitter of the transistor $Q_{12}$. The collector of the transistor $Q_{15}$ and the emitter of the transistor $Q_{16}$ are connected to the base of the output stage transistor $Q_{13}$, while the emitter of the transistor $Q_{15}$ and the collector of the transistor $Q_{16}$ are connected to the base of the other output stage transistor $Q_{14}$.

The transistors $Q_{15}$ and $Q_{16}$ in FIG. 11 are made conductive by currents flowing through the resistors $R_{11}$ and $R_{12}$, which currents are caused by a discharge of the charge carriers stored in the output transistors $Q_{13}$ and $Q_{14}$. Accordingly, the time constant for discharging of the stored carriers in the output transistors is determined by the product of the capacitance between the base and collector of the output transistor multiplied by the resistance of the parallel connection of the dynamic resistances, upon the conducting of the transistors $Q_{15}$ and $Q_{16}$. Therefore, for the same reasons as those described above in connection with FIG. 7, the equivalent effects and advantages can be obtained, and the disadvantages in the prior art can be eliminated. Moreover, in the preferred embodiment shown in FIG. 11, the resistors $R_{11}$ and $R_{12}$ (serving as current-voltage converter means) do not supply the base-emitter voltages to switch on the transistors $Q_{15}$ and $Q_{16}$. Therefore, the resistors $R_{11}$ and $R_{12}$ may be designed to have resistance values which are higher than the values of resistors $R_5$ and $R_6$ in FIG. 7.

As a matter of course, the present invention is applicable to all power amplifiers having a complementary SEPP circuit. For example, it is applicable to a complementary SEPP amplifier employing a differential amplifier as its input stage and supplying the different voltage from the differential amplifier to the respective bases of the emitter follower transistors.

What is claimed is:

1. A power amplifier comprising first and second transistors having emitter-collector paths connected in series, third and fourth transistors individually connected to said first and second transistors respectively in order to form equivalent unit transistors, means for applying an input signal to an amplifier composed of said first to fourth transistors, means for deriving an output from an electrical path interconnecting said first and second transistors, first and second resistive elements each having one of its ends connected to individually associated bases of said first and second transistors, and fifth and sixth transistors individually associated with said first and second resistive elements, said fifth and sixth transistors having their bases connected respectively to the other ends of said first and second resistive elements, and said fifth and sixth transistors having their respective emitter-collector paths connected in parallel with each other between the bases of said first and second transistors.

2. The power amplifier claimed in claim 1, wherein said other ends of said first and second resistive elements are connected to each other.

3. The power amplifier claimed in claim 1, wherein said other ends of said first and second resistive elements are electrically separated from each other.

4. The power amplifier claimed in claim 1, wherein said first and third transistors are interconnected to form an equivalent unit transistor of one conductivity type, and said second and fourth transistors are interconnected to form an equivalent unit transistor of the other conductivity type.

5. A transistor amplifier comprising an input terminal for receiving an input signal, a first transistor, a second transistor, means for applying said input signal to the bases of said first and second transistors, a third transistor having a base and a collector coupled to the emitter and the collector, respectively, of said first transistor, a fourth transistor having a base and a collector coupled to the emitter and the collector, respectively, of said second transistor, means for interconnecting the emitters of said third and fourth transistors, means for deriving an output from said interconnecting means, a fifth transistor having an emitter connected to the base of said fourth transistor, said fifth transistor having a collector connected to the base of said third transistor, first resistive means coupled between a base of said fifth transistor and the base of said third transistor, a sixth transistor having an emitter connected to the base of said third transistor, said sixth transistor having a collector connected to the base of said fourth transistor, the emitter-collector paths of said fifth and sixth transistors being in parallel with each other, and second resistive means coupled between the base of said sixth transistor and the base of said fourth transistor.

6. The transistor amplifier claimed in claim 5, wherein said bases of said fifth and sixth transistors are connected to each other.

7. The transistor amplifier claimed in claim 5, wherein said bases of said fifth and sixth transistors are electrically separated from each other.

8. The transistor amplifier claimed in claim 5, wherein said interconnecting means is a series connection of first and second resistors, and said output deriving means derives said output from the junction point between said first and second resistors.

9. The transistor amplifier claimed in claim 5, 6 or 8, wherein said first and second resistive means have a resistance of 100 to 300 ohms.

10. A power amplifier having an output terminal driven by a complementary pair of power transistors, means for applying input signals to base electrodes of said complementary pair of transistors for operating them in a complementary manner to amplify said input signal, whereby stored charge carriers tend to accumulate and be stored in the semiconductor material of said transistors, a pair of dynamic resistor means connected to base electrodes of said power transistors, and means responsive to said input signals for simultaneously driving said pair of power transistors and said dynamic resistor means so that said dynamic resistor means comprises a fast-acting, low-resistance path for discharging said charge carriers stored in said semiconductor material.

11. The power amplifier of claim 10 wherein said pair of dynamic resistor comprises a pair of transistors having opposite conductivity characteristics.

12. The power amplified of claim 10 wherein said stored charge carriers are discharged with a time constant determined by the base to collector capacitances of said power amplifiers and the instantaneous resistances of said dynamic resistors.

13. The power amplifier of claim 12 wherein said time constant is at least as short as a half wave in a 100 KHZ waveform.

14. The power amplifier of claim 10 wherein each of said pair of dynamic resistors comprises a resistor with a semiconductor switch connected in parallel therewith.

15. The power amplifier of claim 14 wherein each of said semiconductor switches is a transistor, and the transistors comprising the pair of dynamic resistors are transistors of opposite conductive types.

* * * * *

UNITED STATES PATENT AND TRADEMARK OFFICE
CERTIFICATE OF CORRECTION

PATENT NO. : 4,317,081
DATED : February 23, 1982
INVENTOR(S) : KOBAYASHI, Toshio It is certified that error appears in the above—identified patent and that said Letters Patent is hereby corrected as shown below:

Col. 1, Line 62, delete "second transistors".

Col. 2, Line 9, insert a comma --,-- after "conducting".

Col. 3, Line 44, insert a comma --,-- after "signal".

Col. 4, Line 31, insert --nominally cut off-- after "other"; insert --to-- after "transistor".

Col. 4, Line 41, change "which" to --while--.

Col. 5, Line 34, insert a comma --,-- after "distortion".

Col. 5, Line 46, insert a comma --,-- after "Thus".

Signed and Sealed this

First Day of June 1982

[SEAL]

Attest:

GERALD J. MOSSINGHOFF

Attesting Officer — Commissioner of Patents and Trademarks